(12) United States Patent
Hatakeyama

(10) Patent No.: US 9,091,914 B2
(45) Date of Patent: Jul. 28, 2015

(54) RESIST COMPOSITION AND PATTERNING PROCESS

(75) Inventor: Jun Hatakeyama, Joetsu (JP)

(73) Assignee: SHIN-ETSU CHEMICAL CO., LTD., Tokyo (JP)

(*) Notice: Subject to any disclaimer, the term of this patent is extended or adjusted under 35 U.S.C. 154(b) by 0 days.

(21) Appl. No.: 13/372,680

(22) Filed: Feb. 14, 2012

(65) Prior Publication Data

US 2012/0208125 A1 Aug. 16, 2012

(30) Foreign Application Priority Data

Feb. 15, 2011 (JP) ................................. 2011-029596

(51) Int. Cl.
| | | |
|---|---|---|
| G03F 7/027 | (2006.01) | |
| G03F 7/075 | (2006.01) | |
| G03F 7/20 | (2006.01) | |
| G03F 7/004 | (2006.01) | |

(52) U.S. Cl.
CPC ............ *G03F 7/0043* (2013.01); *G03F 7/0048* (2013.01); *G03F 7/0757* (2013.01); *G03F 7/2039* (2013.01)

(58) Field of Classification Search
None
See application file for complete search history.

(56) References Cited

U.S. PATENT DOCUMENTS

| | | | |
|---|---|---|---|
| 5,415,749 A * | 5/1995 | Hamilton ....................... 204/492 |
| 5,534,312 A | 7/1996 | Hill et al. | |
| 6,849,305 B2 | 2/2005 | Bravo-Vasquez et al. | |
| 7,303,855 B2 | 12/2007 | Hatakeyama et al. | |
| 7,358,025 B2 | 4/2008 | Hatakeyama | |
| 7,632,624 B2 | 12/2009 | Hatakeyama et al. | |
| 8,088,554 B2 | 1/2012 | Hatakeyama | |
| 2004/0185372 A1 | 9/2004 | Takakuwa | |
| 2004/0202956 A1 * | 10/2004 | Takahashi et al. ......... 430/270.1 |
| 2005/0048400 A1 * | 3/2005 | Okino et al. .............. 430/270.1 |
| 2005/0244745 A1 * | 11/2005 | Cameron et al. ........... 430/270.1 |
| 2007/0252111 A1 * | 11/2007 | Ohkubo et al. ................ 252/500 |
| 2008/0020325 A1 | 1/2008 | Su et al. | |
| 2009/0233223 A1 * | 9/2009 | Tachibana et al. ......... 430/270.1 |
| 2009/0269696 A1 * | 10/2009 | Ohsawa et al. ............ 430/270.1 |
| 2009/0317742 A1 * | 12/2009 | Toriumi et al. ............ 430/270.1 |
| 2010/0047709 A1 | 2/2010 | Echigo et al. | |
| 2010/0203444 A1 * | 8/2010 | Sung et al. ................. 430/270.1 |

FOREIGN PATENT DOCUMENTS

| | | | |
|---|---|---|---|
| JP | 53126929 A | * | 11/1978 |
| JP | 07-258587 A | | 10/1995 |
| JP | 2003-122025 A | | 4/2003 |
| JP | 2004-175755 A | | 6/2004 |
| JP | 2004-295116 A | | 10/2004 |
| JP | 2005-055585 A | | 3/2005 |
| JP | 2005-128509 A | | 5/2005 |
| JP | 2006-227391 A | | 8/2006 |
| JP | 2006-259249 A | | 9/2006 |
| JP | 2006-259482 A | | 9/2006 |
| JP | 2006-285095 A | | 10/2006 |
| JP | 2006-293207 A | | 10/2006 |
| JP | 2006-293298 A | | 10/2006 |
| JP | 2007-199653 A | | 8/2007 |
| JP | 2007298841 A | * | 11/2007 |
| JP | 2007-316282 A | | 12/2007 |
| JP | 2008-116677 A | | 5/2008 |
| JP | 2010-92802 A | | 4/2010 |
| JP | 2010-234212 A | | 10/2010 |
| JP | 2011-118365 A | | 6/2011 |
| WO | 2011/129210 A1 | | 10/2011 |

OTHER PUBLICATIONS

English Translation of JP53126929.*
English Translation of JP2007298841, published in Nov. 2007.*
Hinsberg, William et al., "Extendibility of Chemically Amplified Resists: Another Brick Wall?", Proceedings of SPIE, 2003, pp. 1-14, vol. 5039.
Jones, G.A.C. et al., "Fabrication of nanoscale ZnO field effect transistors using the functional precursor zinc neodecanoate directly as a negative electron beam lithography resist", J. Vac. Sci. Technol., 2009, pp. 3164-3168, vol. 27.
Ridaoui, Hassan et al., "Direct ArF laser photopatterning of metal oxide nanostructures prepared by the sol-gel route", Nanotechnology, 2010, pp. 1-10, vol. 21.
Office Action dated Nov. 11, 2014, issued in corresponding Japanese Patent Application No. 2012-024626 (4 pages).

* cited by examiner

*Primary Examiner* — Cynthia H Kelly
*Assistant Examiner* — Anna Malloy
(74) *Attorney, Agent, or Firm* — Westerman, Hattori, Daniels & Adrian, LLP

(57) ABSTRACT

A resist composition comprising a complex of a β-diketone with a metal selected from magnesium, chromium, manganese, iron, cobalt, nickel, copper, zinc, silver, cadmium, indium, tin, antimony, cesium, zirconium, and hafnium, and a solvent is improved in film uniformity when coated, and exhibits a high resolution, high sensitivity, and minimal LER when processed by the EB or EUV lithography.

7 Claims, No Drawings

RESIST COMPOSITION AND PATTERNING PROCESS

CROSS-REFERENCE TO RELATED APPLICATION

This non-provisional application claims priority under 35 U.S.C. §119(a) on Patent Application No. 2011-029596 filed in Japan on Feb. 15, 2011, the entire contents of which are hereby incorporated by reference.

TECHNICAL FIELD

This invention relates to a resist composition, and more particularly to a negative resist composition adapted for the EB and EUV lithography processes; and a patterning process using the same.

BACKGROUND ART

To meet the demand for higher integration density and operating speed of LSIs, the effort to reduce the pattern rule is in rapid progress. The wide-spreading flash memory market and the demand for increased storage capacities drive forward the miniaturization technology. As the advanced miniaturization technology, manufacturing of microelectronic devices at the 65-nm node by the ArF lithography has been implemented in a mass scale. Manufacturing of 45-nm node devices by the next generation ArF immersion lithography is approaching to the verge of high-volume application. The candidates for the next generation 32-nm node include ultra-high NA lens immersion lithography using a liquid having a higher refractive index than water in combination with a high refractive index lens and a high refractive index resist film, EUV lithography of 13.5 nm wavelength, and double patterning version of the ArF lithography, on which active research efforts have been made.

The current technology is approaching to the processing size which is reduced below 50 nm as minimum line width. When the processing size is so reduced, the thickness of resist film must be reduced below 100 nm, depending on the surface material of the substrate to be processed, because of such factors as the structural strength to maintain the pattern against the surface tension of developer and the adhesion strength to the substrate. On use of prior art chemically amplified resist materials intended to form high-resolution resist film, for example, no significant degradation of line edge roughness (LER) does occur with a resist film having a thickness of 150 nm, but LER is materially exacerbated when the film thickness is reduced below 100 nm.

As the feature size is reduced, image blurs due to acid diffusion become a problem (see Non-Patent Document 1). To insure resolution for fine patterns with a size of 45 nm et seq., not only an improvement in dissolution contrast as intended in the prior art is requisite, but control of acid diffusion is also important. Since chemically amplified resist compositions are designed such that sensitivity and contrast are enhanced by acid diffusion, an attempt to minimize acid diffusion by reducing the temperature and/or time of post-exposure bake (PEB) results in drastic reductions of sensitivity and contrast.

Addition of an acid generator capable of generating a bulky acid is effective for suppressing acid diffusion. It is then proposed to copolymerize a polymer with an acid generator in the form of an onium salt having polymerizable olefin.

With respect to the patterning of a resist film to a feature size of 16 nm et seq., it is believed impossible in the light of acid diffusion to form such a pattern from a chemically amplified resist film. It would be desirable to have a non-chemically amplified resist material.

A typical non-chemically amplified resist material is polymethyl methacrylate (PMMA). It is a positive resist material which increases solubility in organic solvent developer through the mechanism that the molecular weight decreases as a result of scission of the main chain upon exposure to EB or EUV. Due to the lack of cyclic structure, it has the drawbacks of poor etch resistance and substantial outgassing during exposure.

Hydrogensilsesquioxane (HSQ) is a negative resist material which turns insoluble in alkaline developer through crosslinking by condensation reaction of silanol generated upon exposure to EB or EUV. Also chlorine-substituted calixarene functions as negative resist material. Since these negative resist materials have a small molecular size prior to crosslinking and are free of blur by acid diffusion, they exhibit reduced edge roughness and very high resolution. They are thus used as a pattern transfer material for representing the resolution limit of the exposure tool. However, their sensitivity is two orders of magnitude lower than that of chemically amplified resist materials.

There is a demand for a non-chemically amplified molecular resist material having a sensitivity equivalent to chemically amplified resist materials and a high resolution.

The EB writing of a resist film encounters a problem that the point of writing is shifted by electrostatic charges on the resist film. It is proposed to overlay the resist film with an antistatic film to prevent the resist film from being charged. Undesirably coating of the antistatic film adds to the cost of the overall process.

It was impossible to use metal-containing materials as the photoresist material for the semiconductor lithography because of a possible malfunction of semiconductor devices as a result of metal atoms migrating to the substrate. However, it is known in the application other than the semiconductor, for example, to use a metal compound as the resist material for LCD (see Non-Patent Document 2) or zinc neodecanoate as the patterning material for forming transparent electrode of ZnO. Patent Document 1 shows pattern-forming examples using complexes of silicon, titanium, zirconium, tantalum, barium, strontium, and hafnium with acetylacetone ligands. Patent Document 2 discloses a method for forming a pattern using salts of copper, chromium, cerium, yttrium, barium, and aluminum with carboxyl and amino-containing ligands. Once a pattern is formed, it is converted into a pattern of metal oxide by heat treatment at 300° C.

In the cited documents, a film of metal resist material is formed by spin coating. To enable spin coating, the resist material is diluted with solvents, for example, chloroform, methylene chloride, toluene, acetone, dimethyl sulfoxide, dimethylacetamide, and 2-methoxyethanol. These solvents, however, cannot be used in the industrial application because of their toxicity. In addition, these solvents having low boiling points have so high evaporation rates during spin coating that they may dry up during film formation before the coating thickness becomes uniform. The lack of coating thickness uniformity is a problem.

In the cited documents, development uses resist solvents, which also suffer from the toxic problem.

CITATION LIST

Patent Document 1: U.S. Pat. No. 6,849,305
Patent Document 2: U.S. Pat. No. 5,534,312
Non-Patent Document 1: SPIE Vol. 5039 p1 (2003)

Non-Patent Document 2: J. Vac. Sci. Technol. B27(6), November/December p3164 (2009)

DISCLOSURE OF INVENTION

An object of the invention is to provide a negative resist composition comprising a less toxic, safe solvent which composition has both high resolution and sensitivity, forms a pattern with a satisfactory profile and minimal LER after exposure and development, and has an electro-conductive function to prevent charging during imagewise writing; and a patterning process using the same.

In one aspect, the invention provides a resist composition comprising a metal complex of a β-diketone and a solvent. The metal is selected from the group consisting of magnesium, chromium, manganese, iron, cobalt, nickel, copper, zinc, silver, cadmium, indium, tin, antimony, cesium, zirconium, and hafnium. The solvent is at least one member selected from the group consisting of water, methanol, ethanol, n-propanol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-2-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, 1-heptanol, cyclohexanol, octanol, methyl lactate, ethyl lactate, propyl lactate, butyl lactate, propylene glycol, butanediol monomethyl ether, propylene glycol monomethyl ether, butanediol monoethyl ether, propylene glycol monoethyl ether, butanediol monopropyl ether, propylene glycol monopropyl ether, propylene glycol monomethoxymethyl ether, propylene glycol monoacetate, diacetone alcohol, allyl alcohol, propargyl alcohol, 3-methyl-1-pentyn-3-ol, 3-methyl-1-butyn-3-ol, furfuryl alcohol, tetrahydrofurfuryl alcohol, and glycidol.

Preferably, the metal complex of a β-diketone is selected from complexes of the following general formulae.

$$Mg^{2+}(R^1COCH_2COR^2)^-_2$$

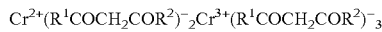

$$Cr^{2+}(R^1COCH_2COR^2)^-_2 \quad Cr^{3+}(R^1COCH_2COR^2)^-_3$$

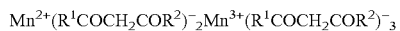

$$Mn^{2+}(R^1COCH_2COR^2)^-_2 \quad Mn^{3+}(R^1COCH_2COR^2)^-_3$$

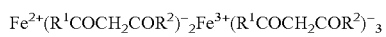

$$Fe^{2+}(R^1COCH_2COR^2)^-_2 \quad Fe^{3+}(R^1COCH_2COR^2)^-_3$$

$$Co^{2+}(R^1COCH_2COR^2)^-_2$$

$$Ni^{2+}(R^1COCH_2COR^2)^-_2$$

$$Cu^+(R^1COCH_2COR^2)^- \quad Cu^{2+}(R^1COCH_2COR^2)^-_2$$

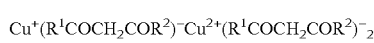

$$Zn^+(R^1COCH_2COR^2)^- \quad Zn^{2+}(R^1COCH_2COR^2)_2$$

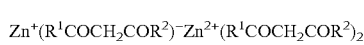

$$Ag^+(R^1COCH_2COR^2)^-$$

$$Cd^{2+}(R^1COCH_2COR^2)^-_2$$

$$In^{3+}(R^1COCH_2COR^2)^-_3$$

$$Sn^{2+}(R^1COCH_2COR^2)^-_2 \quad Sn^{4+}(R^1COCH_2COR^2)_4$$

$$Sb^{3+}(R^1COCH_2COR^2)^-_3$$

$$Cs^+(R^1COCH_2COR^2)^-$$

$$Zr^{4+}(R^1COCH_2COR^2)^-_4$$

$$Hf^{4+}(R^1COCH_2COR^2)^-_4$$

Herein $R^2$ and $R^2$ are each independently a straight, branched or cyclic $C_1$-$C_{20}$ alkyl group, $C_2$-$C_{20}$ alkenyl group, $C_2$-$C_{20}$ alkynyl group, or $C_6$-$C_{20}$ aryl group, which group may contain a hydroxyl, alkoxy, ether, ester, amino, amide, sulfonic acid ester, halogen, cyano, nitro, carbonate, carbamate, thiol, sulfide, thioketone radical, or hetero-aromatic ring.

The resist composition may further comprising a resin having a weight-average molecular weight of 200 to 20,000 by GPC versus polystyrene standard and selected from the group consisting of phenolic resins, silsesquioxane resins, silicon oxide base resins, zirconium oxide base resins, zinc oxide base resins, titanium oxide base resins, and hafnium oxide base resins.

In another aspect, the invention provides a pattern forming process comprising the steps of coating the resist composition defined above onto a substrate, baking, exposing to high-energy radiation, and developing with a developer.

Specifically, the developer is alkaline water, and more specifically, an aqueous solution of at least one hydroxide selected from the group consisting of tetramethylammonium hydroxide, tetraethylammonium hydroxide, tetrapropylammonium hydroxide, tetrabutylammonium hydroxide, choline hydroxide, sodium hydroxide, and potassium hydroxide.

Typically the high-energy radiation is EUV radiation having a wavelength of 3 to 15 nm or EB at an accelerating voltage of 1 to 150 keV.

Since the metal selected from among magnesium, chromium, manganese, iron, cobalt, nickel, copper, zinc, silver, cadmium, indium, tin, antimony, cesium, zirconium, and hafnium has high absorption to such radiation as EB or EUV, the resist composition comprising the metal complex of diketone has a relatively high sensitivity as non-chemically amplified resist material. In addition, the resist composition forms a pattern with a satisfactory profile after exposure and development, avoids the problem of image blur due to acid diffusion as often found with chemically amplified resist materials, and minimizes LER because of a very low molecular weight. By virtue of these advantages, the resist composition is fully acceptable in the commercial application and best suited as VLSI-forming resist material and mask pattern-forming material.

Since the metal complex is electroconductive, it prevents the resist film from being charged during EB imagewise writing and thus prevents any positional shift during imagewise writing.

ADVANTAGEOUS EFFECTS OF INVENTION

The resist composition has many advantages including a high resolution and a minimal edge roughness. It may be a negative resist composition suited as the micropatterning material for fabrication of VLSIs and photomasks, and the patterning material in the EB and EUV lithography.

DESCRIPTION OF EMBODIMENTS

The terms "a" and "an" herein do not denote a limitation of quantity, but rather denote the presence of at least one of the referenced item. As used herein, the notation ($C_n$—$C_m$) means a group containing from n to m carbon atoms per group.

The abbreviations and acronyms have the following meaning.

UV: ultraviolet radiation
EUV: extreme ultraviolet
EB: electron beam
Mw: weight average molecular weight
Mn: number average molecular weight
Mw/Mn: molecular weight distribution or dispersity
PEB: post-exposure bake
LER: line edge roughness
LWR: line width roughness While the effort to reduce the pattern rule is in rapid progress to meet the demand for higher integration density and operating speed of LSIs as alluded to previously, there is a need for a resist composition which has a high resolution and a high sensitivity and forms a pattern with a satisfactory profile and minimal LER through exposure and development.

Seeking for the currently desired resist material having a high resolution, high sensitivity and minimal LER the inventor has found that better results are obtained from a negative resist composition comprising a complex of a β-diketone with a metal selected from among magnesium, chromium, manganese, iron, cobalt, nickel, copper, zinc, silver, cadmium, indium, tin, antimony, cesium, zirconium, and hafnium. Since these metals have high absorption to such radiation as EB or EUV, the resist composition comprising the metal complex of β-diketone has a high sensitivity as non-chemically amplified resist material. The metal complex of β-diketone converts to a metal oxide upon exposure to high-energy radiation. While the metal complex of β-diketone is soluble in alkaline aqueous solution, the metal oxide is insoluble in alkaline developer. In this sense, the resist composition is negative working.

The metal complex of β-diketone constitutes a non-chemically amplified molecular resist. A high resolution is available because the image blur due to acid diffusion is avoided. Since the metal complex has a small molecular size as compared with polymer-based resist materials, the occurrence of edge roughness caused by fluctuations of molecular size is minimized. For this reason, the resist composition is characterized by minimal edge roughness. In addition, because of its electric conduction, the metal complex prevents the resist film from being electrically charged during EB image writing. There is provided a resist composition, specifically negative resist composition suited as the micropatterning material for the fabrication of VLSIs and photomasks.

While the resist composition comprises a complex of a β-diketone with a metal selected from among magnesium, chromium, manganese, iron, cobalt, nickel, copper, zinc, silver, cadmium, indium, tin, antimony, cesium, zirconium, and hafnium, the complex is preferably selected from complexes of the following general formulae.

$Mg^{2+}(R^1COCH_2COR^2)^-_2$ $Cr^{2+}(R^1COCH_2COR^2)^-_2 Cr^{3+}(R^1COCH_2COR^2)^-_3$ $Mn^{2+}(R^1COCH_2COR^2)^-_2 Mn^{3+}(R^1COCH_2COR^2)^-_3$ $Fe^{2+}(R^1COCH_2COR^2)^-_2 Fe^{3+}(R^1COCH_2COR^2)^-_3$ $Co^{2+}(R^1COCH_2COR^2)^-_2$ $Ni^{2+}(R^1COCH_2COR^2)^-_2$ $Cu^+(R^1COCH_2COR^2)^- Cu^{2+}(R^1COCH_2COR^2)^-_2$ $Zn^+(R^1COCH_2COR^2)^- Zn^{2+}(R^1COCH_2COR^2)^-_2$ $Ag^+(R^1COCH_2COR^2)^-$ $Cd^{2+}(R^1COCH_2COR^2)^-_2$ $In^{3+}(R^1COCH_2COR^2)^-_3$ $Sn^{2+}(R^1COCH_2COR^2)^-_2 Sn^{4+}(R^1COCH_2COR^2)^-_4$ $Sb^{3+}(R^1COCH_2COR^2)^-_3$ $Cs^+(R^1COCH_2COR^2)^-$ $Zr^{4+}(R^1COCH_2COR^2)^-_4$ $Hf^{4+}(R^1COCH_2COR^2)^-_4$

Herein $R^1$ and $R^2$ are each independently a straight, branched or cyclic $C_1$-$C_{20}$ alkyl group, $C_2$-$C_{20}$ alkenyl group, $C_2$-$C_{20}$ alkynyl group, or $C_6$-$C_{20}$ aryl group, which may contain a hydroxyl, alkoxy, ether, ester, amino, amide, sulfonic acid ester, halogen, cyano, nitro, carbonate, carbamate, thiol, sulfide, thioketone radical, or hetero-aromatic ring.

In the foregoing general formulae, the β-diketones are substituted or unsubstituted acetylacetones, examples of which are illustrated below. An acetylacetone derivative which is substituted with a substituent group having more carbon atoms is more soluble in organic solvents whereas an acetylacetone derivative which is substituted with a substituent group having less carbon atoms is more soluble in water and more likely to form a hydrate in solid form. An acetylacetone derivative which is substituted with a substituent group having more carbon atoms is more effective for improving coating thickness uniformity when the resist composition is spin coated, but produces a larger amount of outgassing during exposure and undergoes more shrinkage when it is converted into metal oxide.

Acetylacetone enolizes to form a complex with a metal $M^{2+}$ as illustrated below.

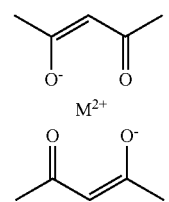

Examples of the β-diketones, i.e., substituted or unsubstituted acetylacetones are shown below.

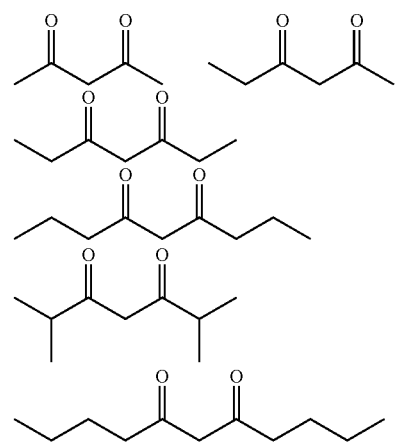

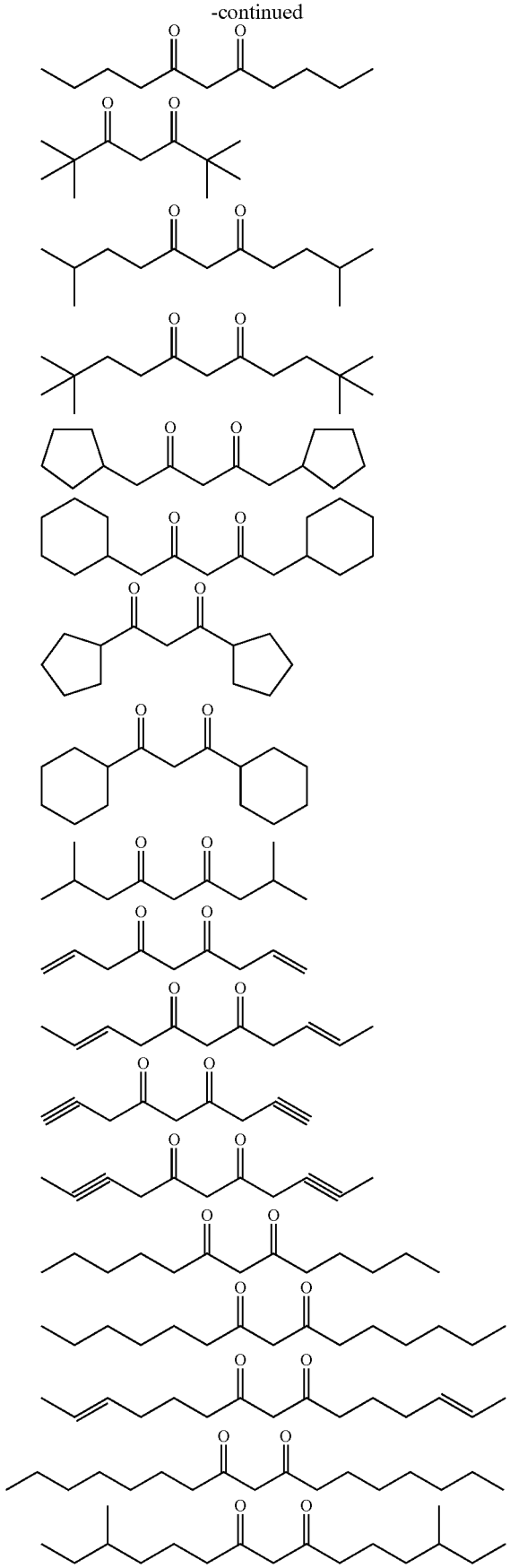
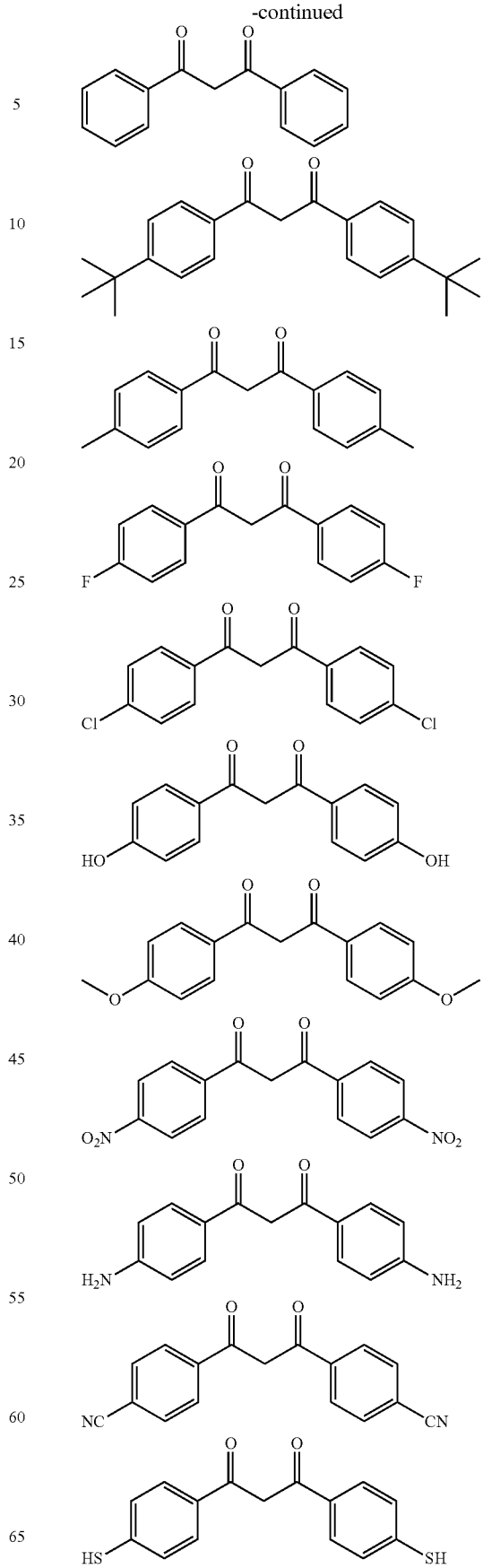

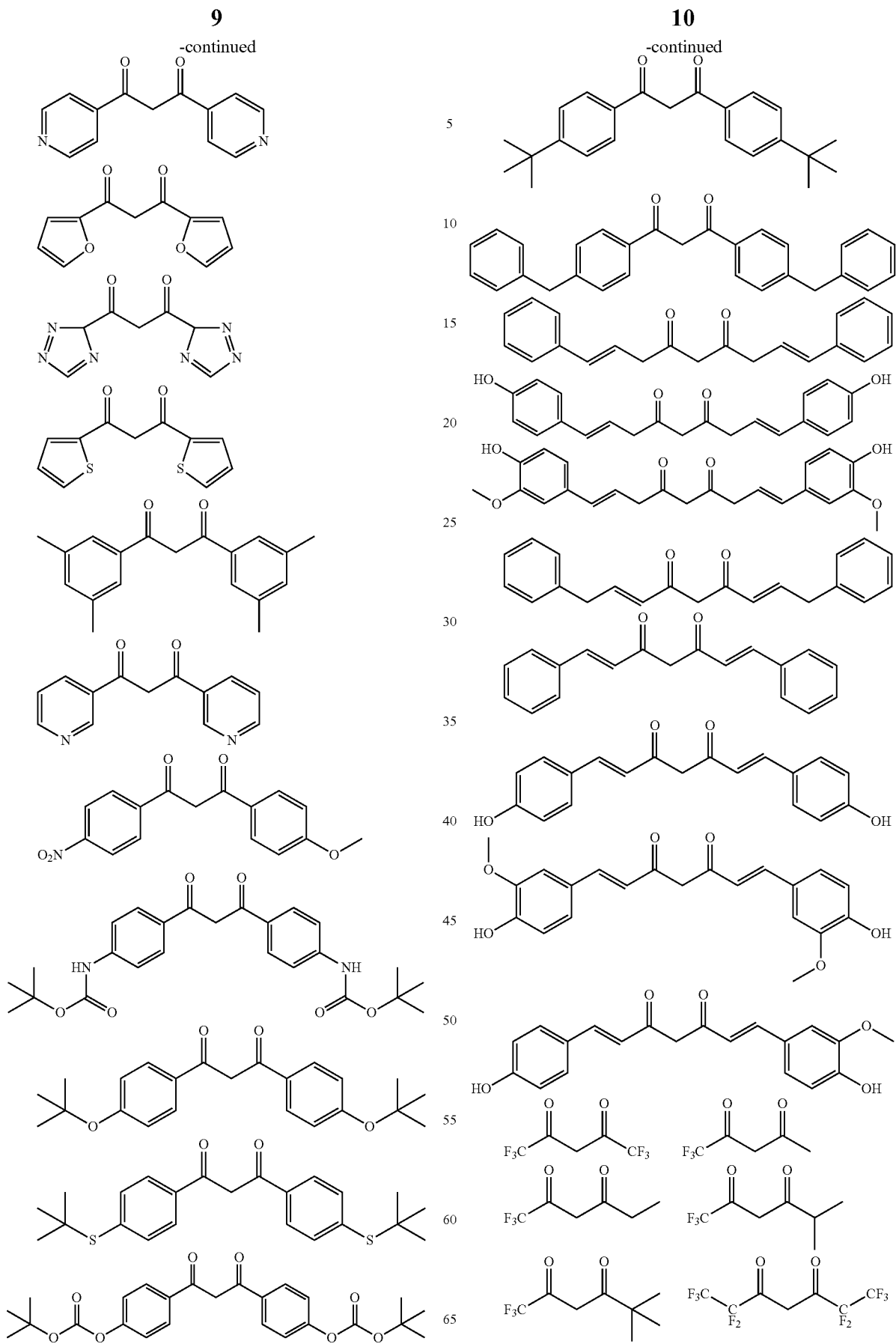

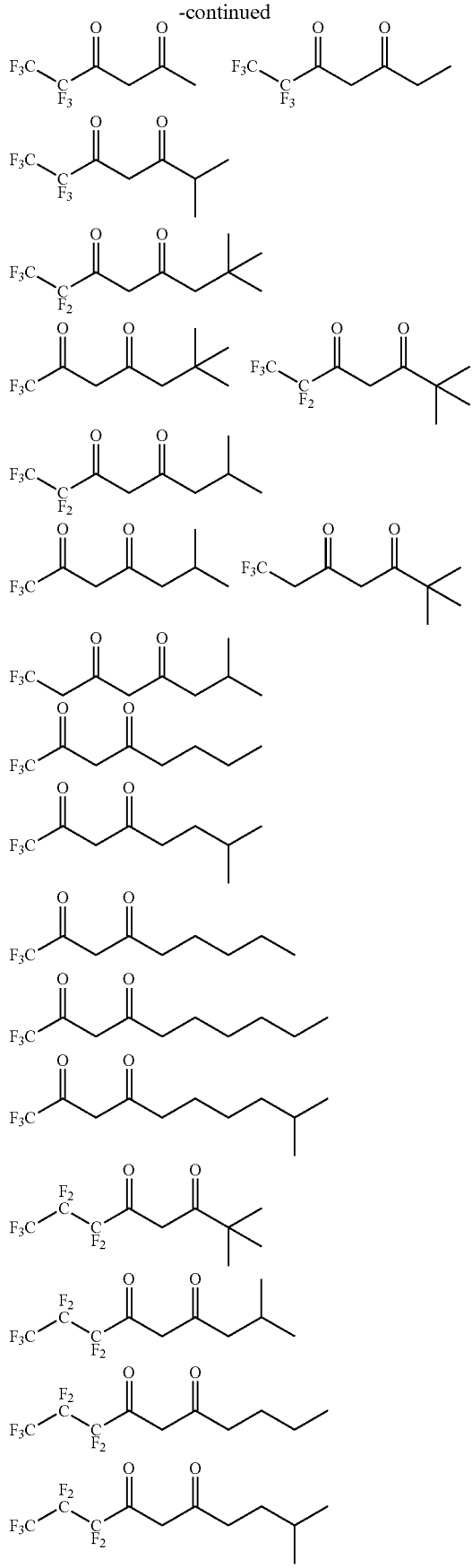
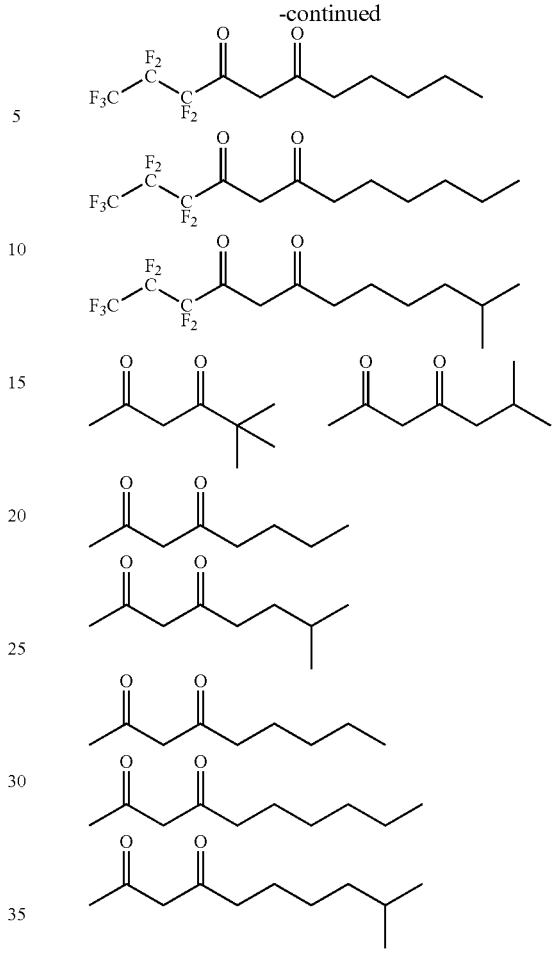

For most β-diketones, $R^1$ and $R^2$ in the general formulae are the same although $R^1$ and $R^2$ may be different as described in JP-A 2004-175755. Those acetylacetones in which both $R^1$ and $R^2$ are methyl are typical, but have low solubility in organic solvents. The total number of carbon atoms included in $R^1$ and $R^2$ is preferably at least 3, more preferably at least 4.

The solvent which can be used in the resist composition is selected from among water, methanol, ethanol, n-propanol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-2-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, 1-heptanol, cyclohexanol, octanol, methyl lactate, ethyl lactate, propyl lactate, butyl lactate, propylene glycol, butanediol monomethyl ether, propylene glycol monomethyl ether, butanediol monoethyl ether, propylene glycol monoethyl ether, butanediol monopropyl ether, propylene glycol monopropyl ether, propylene glycol monomethoxymethyl ether, propylene glycol monoacetate, diacetone alcohol, allyl alcohol, propargyl alcohol, 3-methyl-1-pentyn-3-ol, 3-methyl-1-butyn-3-ol, furfuryl alcohol, tetrahydrofurfuryl alcohol, and glycidol, and mixtures thereof.

While the resist composition is a negative resist composition essentially comprising a complex of a β-diketone with a metal selected from among magnesium, chromium, manganese, iron, cobalt, nickel, copper, zinc, silver, cadmium, indium, tin, antimony, cesium, zirconium, and hafnium, a resin having a weight-average molecular weight of 200 to 20,000 by GPC versus polystyrene standard is desirably added thereto for promoting crosslinking. The resin used herein may be selected from among phenolic resins, silsesquioxane resins, silicon oxide base resins, zirconium oxide base resins, zinc oxide base resins, titanium oxide base resins, and hafnium oxide base resins. Suitable phenolic resins include polyhydroxystyrene, polyhydroxynaphthalene, poly (hydroxyphenyl methacrylate), poly(hydroxynaphthyl methacrylate), and copolymers thereof with styrene, vinylnaphthalene, vinylanthracene, vinylbiphenyl, vinylcarbazole, indene, acenaphthylene, nortricyclene derivatives, norbornene derivatives, maleic anhydride, maleimide derivatives, and methacrylate derivatives. Suitable other phenolic resins include novolak resins obtained from condensation of phenols with aldehydes, exemplary phenols including phenol, o-cresol, m-cresol, p-cresol, 2,3-dimethylphenol, 2,5-dimethylphenol, 3,4-dimethylphenol, 2,3-dimethylphenol, 2,4-dimethylphenol, 2,6-dimethylphenol, 2,3,5-trimethylphenol, 3,4,5-trimethylphenol, 2-t-butylphenol, 3-t-butylphenol, 4-t-butylphenol, 2-phenylphenol, 3-phenylphenol, 4-phenylphenol, 3,5-diphenylphenol, 2-naphthylphenol, 3-naphthylphenol, 4-naphthylphenol, 4-tritylphenol, resorcinol, 2-methylresorcinol, 4-methylresorcinol, 5-methylresorcinol, catechol, 4-t-butylcatechol, 2-methoxyphenol, 3-methoxyphenol, 2-propylphenol, 3-propylphenol, 4-propylphenol, 2-isopropylphenol, 3-isopropylphenol, 4-isopropylphenol, 2-methoxy-5-methylphenol, 2-t-butyl-5-methylphenol, pyrogallol, thymol, isothymol, 1-naphthol, 2-naphthol, 2-methyl-1-naphthol, 4-methoxy-1-naphthol, and 7-methoxy-2-naphthol, as well as dihydroxynaphthalenes such as 1,5-dihydroxynaphthalene, 1,7-dihydroxynaphthalene, and 2,6-dihydroxynaphthalene, and methyl 3-hydroxy-naphthalene-2-carboxylate; and calixarene resins.

Also included are phenolic monomers and novolak resins of these phenolic monomers condensed with aldehydes as described in JP-A 2005-128509, JP-A 2006-227391, JP-A 2006-259249, JP-A 2006-259482, JP-A 2006-285095, JP-A 2006-293207, JP-A 2006-293298, JP-A 2007-199653, and JP-A 2007-316282, and calix-resorcin resins as described in JP-A 2008-116677.

The silsesquioxane resins and silicon oxide resins include resins resulting from condensation of alkoxysilanes. The zirconium oxide base resins, zinc oxide base resins, titanium oxide base resins, and hafnium oxide base resins include condensates of alkoxyzirconium, alkoxyzinc, alkoxytitanium, and alkoxyhafnium compounds, and mixtures thereof as illustrated in Nanotechnology 21 (2010) 065303 (10 pp).

The solvent is preferably used in an amount of 50 to 10,000 parts, more preferably 100 to 8,000 parts by weight per 100 parts by weight of the complex. If used, the resin is preferably added in an amount of 20 to 10,000 parts, more preferably 50 to 8,000 parts by weight per 100 parts by weight of the complex.

In the second aspect, the invention provides a pattern forming process comprising the steps of coating the resist composition defined above onto a substrate, baking to form a resist film, exposing the resist film to high-energy radiation, and developing the exposed resist film with a developer.

Examples of the high-energy radiation include excimer lasers such as KrF, ArF, Xe, $F_2$ and $Ar_2$ excimer lasers, excimer lamps, EUV, and EB. The energy of exposure causes the complex to be dissociated into a metal ion and an acetylacetone ion. The resulting metal ion forms a metal oxide by combining with oxygen in water or acetylacetone. The metal complex is soluble in alkaline aqueous solution whereas the metal oxide is insoluble therein. In this way, a negative pattern is formed.

After the pattern is formed, it may be baked to promote formation of metal oxide. Suitable bake conditions include a temperature of 70 to 200° C. and a time of 1 to 300 seconds.

The step of exposing the resist film to high-energy radiation may use EUV having a wavelength of 3 to 15 nm, and accelerated EB at an accelerating voltage of 1 to 150 keV, preferably 5 to 120 keV, more preferably up to 50 keV, and even more preferably up to 10 keV. Exposure to EUV and EB having a shorter wavelength and higher energy density than the excimer laser is preferred because of a higher reaction efficiency to metal oxide.

Since the complex of a metal selected from among magnesium, chromium, manganese, iron, cobalt, nickel, copper, zinc, silver, cadmium, indium, tin, antimony, cesium, zirconium, and hafnium is electroconductive, it is effective for preventing the resist film from electrostatic charges during EB image writing. This eliminates a need for an antistatic film on the resist film.

The metal selected from among magnesium, chromium, manganese, iron, cobalt, nickel, copper, zinc, silver, cadmium, indium, tin, antimony, cesium, zirconium, and hafnium has strong absorption to EUV radiation of 13.5 nm wavelength. Since the energy absorption upon exposure to EUV accelerates dissociation of the complex into metal and β-diketone, the sensitivity is improved over silicon and analogs exhibiting less absorption.

The resist composition is used in the fabrication of various integrated circuits and masks. Pattern formation using the resist composition may be performed by well-known lithography processes although the process is not limited thereto.

The resist composition is first applied onto a substrate on which an integrated circuit is to be formed or a processable layer on the substrate (e.g., Si, $SiO_2$, SiN, SiON, TiN, WSi, BPSG, SOG, or organic antireflective coating) or a substrate on which a mask circuit is to be formed or a processable layer on the substrate (e.g., Cr, CrO, CrON, MoSi, or $SiO_2$) by a suitable coating technique such as spin coating, roll coating, flow coating, dip coating, spray coating or doctor coating. The coating is prebaked on a hot plate at a temperature of 60 to 150° C. for 10 seconds to 30 minutes, preferably 80 to 120° C. for 30 seconds to 20 minutes. The resulting resist film is generally 0.01 to 2.0 μm thick.

The resist film is then exposed to a desired pattern of high-energy radiation such as UV, deep-UV, EB, x-ray, excimer laser light, y-ray, synchrotron radiation or EUV (soft x-ray), directly or through a mask. The exposure dose is preferably about 1 mJ/cm² to 1 J/cm², more preferably about 10 to 500 mJ/cm², or 0.1 μC/cm² to 1 mC/cm², more preferably 0.5 to 500 μC/cm². The resist film is further baked (PEB) on a hot plate at 60 to 200° C. for 10 seconds to 30 minutes, preferably 80 to 150° C. for 30 seconds to 20 minutes. Since the resist composition of the invention is not a chemically amplified resist composition relying on acid catalysis, the PEB step is not necessarily needed. Nevertheless, the PEB step can promote conversion of metal complex to metal oxide.

Thereafter the resist film is developed with a developer in the form of an aqueous base solution. Suitable developers are 0.1 to 30 wt %, preferably 0.1 to 5 wt %, and more preferably 2 to 3 wt % aqueous solutions of tetramethylammonium hydroxide (TMAH), tetraethylammonium hydroxide (TEAH), tetrapropylammonium hydroxide (TPAH), tetrabutylammonium hydroxide (TBAH), choline hydroxide, sodium hydroxide (NaOH), and potassium hydroxide (KOH). Other suitable developers are 0.1 to 30 wt % aqueous solutions of bases which include ammonia, methylamine, ethylamine, propylamine, n-butylamine, dimethylamine, diethylamine, dipropylamine, di-n-butylamine, trimethylamine, triethylamine, tri-n-propylamine, tri-n-butylamine, hydrazine, hydrazine hydrate, methylhydrazine, dimethylhydrazine, trimethylhydrazine, tetramethylhydrazine, ethylhydrazine, diethylhydrazine, propylhydrazine, butylhydrazine, phenylhydrazine, benzylhydrazine, phenethylhydrazine, cyclopropylhydrazine, cyclopentylhydrazine, cyclohexylhydrazine, ethylenediamine, 1,2-diaminopropane, 1,3-diaminopropane, 1,2-diamino-2-methylpropane, N-methylethylenediamine, N-ethylethylenediamine, N-isopropylethylenediamine, N-hexylethylenediamine, N-cyclohexylethylenediamine, N-octylethylenediamine, N-decylethylenediamine, N-dodecylethylenediamine, N,N-dimethylethylenediamine, N,N'-dimethylethylenediamine, N,N-diethylethylenediamine, N,N'-diethylethylenediamine, N,N'-diisopropylethylenediamine, N,N,N'-trimethylethylenediamine, diethylenetriamine, N-isopropyldiethylenetriamine, N-(2-aminoethyl)-1,3-propanediamine, triethylenetetramine, N,N'-bis(3-aminopropyl)ethylenediamine, N,N'-bis(2-eminoethyl)-1,3-propanediamine, tris(2-aminoethyl)amine, tetraethylenepentamine, pentaethylenehexamine, 2-(2-aminoethylamino)ethanol, N,N'-bis(hydroxyethyl)ethylenediamine, N-(hydroxyethyl)diethylenetriamine, N-(hydroxyethyl)triethylenetetramine, piperazine, 1-(2-aminoethyl)piperazine, 4-(2-aminoethyl)morpholine, polyethyleneimine, 1,3-diaminopropane, 1,4-diaminobutane, 1,3-diaminopentane, 1,5-diaminopentane, 2,2-dimethyl-1,3-propanediamine, hexamethylenediamine, 2-methyl-1,5-diaminopropane, 1,7-diaminoheptane, 1,8-diaminooctane, 2,2,4-trimethyl-1,6-hexanediamine, 2,4,4-trimethyl-1,6-hexanediamine, 1,9-diaminononane, 1,10-diaminodecane, 1,12-diaminododecane, N-methyl-1,3-propanediamine, N-ethyl-1,3-propanediamine, N-isopropyl-1,3-propanediamine, N,N-dimethyl-1,3-propanediamine, N,N'-dimethyl-1,3-propanediamine, N,N'-diethyl-1,3-propanediamine, N,N'-diisopropyl-1,3-propanediamine, N,N,N'-trimethyl-1,3-propanediamine, 2-butyl-2-ethyl-1,5-pentanediamine, N,N'-dimethyl-1,6-hexanediamine, 3,3'-diamino-N-methyldipropylamine, N-(3-aminopropyl)-1,3-propanediamine, spermidine, bis(hexamethylene)triamine, N,N',N''-trimethylbis(hexamethylene)triamine, 4-aminomethyl-1,8-octanediamine, N,N'-bis(3-aminopropyl)-1,3-propanediamine, spermine, 4,4'-methylenebis(cyclohexylamine), 1,2-diaminocyclohexane, 1,4-diaminocyclohexane, 1,3-cyclohexanebis(methylamine), 1,4-cyclohexanebis(methylamine), 1,2-bis(aminoethoxy)ethane, 4,9-dioxa-1,12-dodecanediamine, 4,7,10-trioxa-1,13-tridecanediamine, 1,3-diaminohydroxypropane, 4,4'-methylenedipiperidine, 4-(aminomethyl)piperidine, homopiperazine, 3-aminopyrrolidine, 4-aminopiperidine, 3-(4-aminobutyl)piperidine, polyallylamine, 1,8-diazabicyclo[5.4.0]-7-undecene (DBU), 1,5-diazabicyclo[4.3.0]-5-nonene (DBN), 1,4-diazabicyclo[2.2.2]octane (DABCO), 1,4,7-trimethyl-1,4,7-triazacyclononane, 1,5,9-trimethyl-1,5,9-triazacyclododecane, 1,4,8,11-tetramethyl-1,4,8,11-tetraazacyclotetradecane, and 4,4'-trimethylenebis(1-methylpiperidine). The development may be carried out usually for 3 seconds to 3 minutes, preferably 5 seconds to 2 minutes by conventional techniques such as dip, puddle or spray techniques. The resist film in the exposed area is not dissolved in the developer whereas the resist film in the unexposed area is dissolved. In this way, the desired negative pattern is formed on the substrate. Following development, the resist pattern is rinsed with deionized water and dried by spin drying.

EXAMPLE

Examples of the invention are given below by way of illustration and not by way of limitation. The abbreviation "pbw" is parts by weight. The weight average molecular weight (Mw) and the number average molecular weight (Mn) are the value by GPC versus polystyrene standard.

Examples 1 to 16 and Comparative Examples 1 to 9

Negative resist compositions were prepared by dissolving a metal acetylacetone complex and a blending resin in a solvent in accordance with the recipe shown in Tables 1 and 2 and filtering the solution through a filter having a pore size of 0.2 μm. The solvent contained 100 ppm of a fluorochemical surfactant FC-4430 (3M).

The components in Tables 1 and 2 are as identified below.

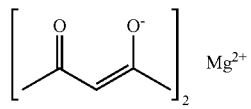

bis(2,4-pentanedionato)magnesium

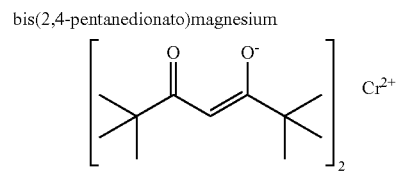

bis(2,2,6,6-tetamethyl-3,5-heptanedionato)chromium

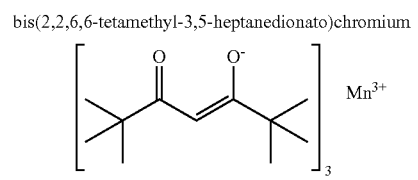

tris(2,2,6,6-tetamethyl-3,5-heptanedionato)manganese

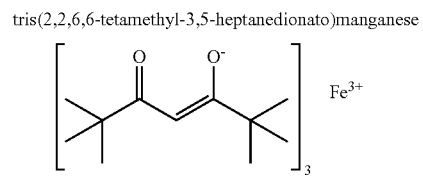

tris(2,2,6,6-tetamethyl-3,5-heptanedionato)iron

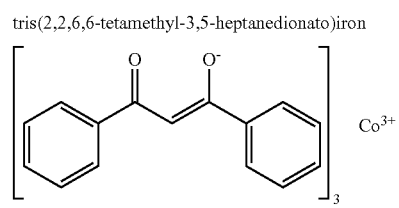

tris(1,3-diphenyl-1,3-propanedione)cobalt

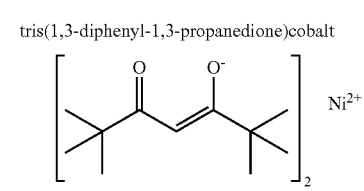

bis(2,2,6,6-tetamethyl-3,5-heptanedionato)nickel

-continued

[structure: tris(1,3-diphenyl-1,3-propanedione)indium, In³⁺]

tris(1,3-diphenyl-1,3-propanedione)indium

[structure with Cs⁺]

(2,2,6,6-tetamethyl-3,5-heptanedionato)cesium

[structure with Zr⁴⁺]

tetra(2,2,6,6-tetramethyl-3,5-heptanedionatho) zirconium

[structure with Sb³⁺]

tris(2,2,6,6-tetramethyl-3,5-heptanedionatho) antimony

PGME: propylene glycol monomethyl ether
PGEE: propylene glycol monoethyl ether
PGPE: propylene glycol monopropyl ether
PGMEA: propylene glycol monomethyl ether acetate
MEK: methyl ethyl ketone
Hydrogensilsesquioxane (Mw=4,000, Mw/Mn=1.48)
Blending Polymer 1:
  copolymer compositional ratio (molar basis)
  shown below
  Mw=4,600
  Mw/Mn=1.47

Blending Polymer 1

[structure of copolymer: p-hydroxystyrene unit (0.80) and acenaphthylene unit (0.20)]

-continued

Blending phenolic resin 1

[phenolic resin structure]

Mw = 894

Blending phenolic resin 2

[phenolic resin structure with cyclohexyl groups]

Mw = 1,120

Blending silsesquioxane resin 1

$-(SiO_2)_{0.80}-(SiO_2)_{0.20}-$
Mw = 4,500

Blending silsesquioxane-titanium oxide resin 1

$-(SiO_2)_{0.80}-(TiO_2)_{0.20}-$
Mw = 3,800

Blending silsesquioxane-zirconium oxide resin 1

$-(SiO_2)_{0.80}-(ZrO_2)_{0.20}-$
Mw = 3,600

Blending silsesquioxane-hafnium oxide resin 1

$-(SiO_2)_{0.80}-(HfO_2)_{0.20}-$
Mw = 3,200

Acid Generator: PAG1 of the Following Structural Formula

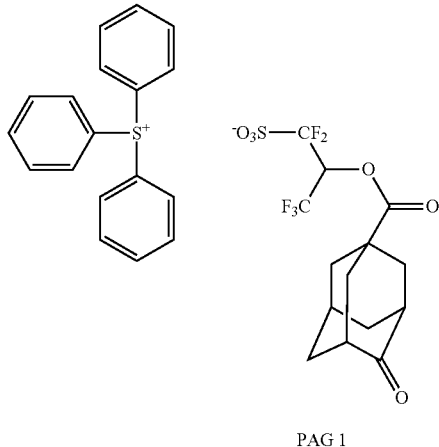

PAG 1

Basic Compound (Amine 1) and Crosslinker of the Following Structural Formulae

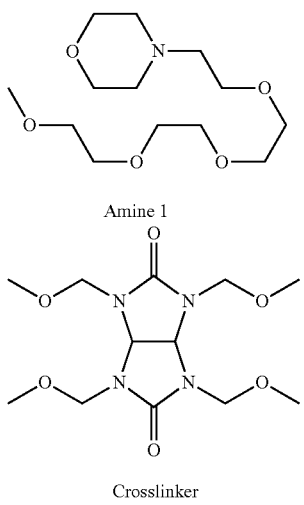

Amine 1

Crosslinker

Coating Uniformity Test

Each resist composition in Tables 1 and 2 was coated onto a 8-inch wafer and baked on a hot plate at 100° C. for 60 seconds for evaporating off the solvent. Resist films of 40 nm thick were formed in Examples 1 to 16 and Comparative Examples 1, 2, 3 and 5 to 9, and a resist film of 60 nm thick was formed in Comparative Example 4. Using an optical film thickness measuring system, the thickness of a film was measured in the plane of the 8-inch wafer. With respect to coating uniformity, the film was rated OK when the difference between maximum and minimum thickness measurements was equal to or less than 2 nm, and NG when the difference exceeded 2 nm. The results are shown in Table 3.

EB Writing Test

In the patterning test, the negative resist compositions prepared by filtering the solutions of Tables 1 and 2 through a filter having a pore size of 0.2 μm were used, and silicon substrates having a diameter of 6 inches were vapor primed with hexamethyldisilazane (HMDS). Using a coater/developer system Clean Track Mark 5 (Tokyo Electron Ltd.), the negative resist composition was spin coated onto the primed silicon substrate and prebaked on a hot plate at 110° C. for 60 seconds to form a resist film. The resist films in Examples 1 to 16 and Comparative Examples 5 to 9 had a thickness of 40 nm, and the resist film in Comparative Example 4 had a thickness of 60 nm.

Using a system HL-800D (Hitachi, Ltd.), the resist film was irradiated imagewise with EB at a HV voltage of 50 keV in a vacuum chamber. The resist films of Comparative Examples 1, 2 and 3 were not subjected to the exposure test because the films had so poor coating uniformity that the exposure test might lack reproducibility.

Using the system Clean Track Mark 5, immediately after the imagewise exposure, the resist film was baked (PEB) at the temperature shown in Table 3 for 60 seconds and puddle developed with a 2.38 wt % TMAH aqueous solution for 20 seconds, yielding a negative pattern.

The pattern was evaluated as follows. Resolution was a minimum size at the exposure dose (sensitivity) that provided a 1:1 resolution of a 100-nm line-and-space pattern. The 100-nm line-and-space pattern was measured for line width roughness (LWR) under SEM.

Table 3 shows the results of sensitivity, resolution, and LWR of the resist compositions.

TABLE 1

|  | Metal salt (pbw) | Solvent (pbw) |
|---|---|---|
| Example Resist 1 | bis(2,4-pentanedionato)magnesium(30) Blending polymer 1(100) | PGEE(5,000) |
| Example Resist 2 | bis(2,2,6,6-tetamethyl-3,5-heptanedionato)chromium(30) Blending polymer 1(100) | PGPE(5,000) |
| Example Resist 3 | tris(2,2,6,6-tetamethyl-3,5-heptanedionato)manganese(30) Blending polymer 1(100) | PGPE(5,000) |
| Example Resist 4 | tris(2,2,6,6-tetamethyl-3,5-heptanedionato)iron(30) Blending polymer 1(100) | tetrahydrofurfuryl alcohol (5,000) |
| Example Resist 5 | tris(1,3-diphenyl-1,3-propanedione)cobalt(30) Blending polymer 1(100) | PGEE(4,000) 2-methyl-1-butanol (1,000) |
| Example Resist 6 | bis(2,2,6,6-tetamethyl-3,5-heptanedionato)nickel(30) Blending polymer 1(100) | PGEE(4,000) 4-methyl-2-pentanol (1,000) |
| Example Resist 7 | tris(1,3-diphenyl-1,3-propanedione)indium(40) Blending polymer 1(100) | PGPE(5,000) |

TABLE 1-continued

| | Metal salt (pbw) | Solvent (pbw) |
|---|---|---|
| Example Resist 8 | (2,2,6,6-tetamethyl-3,5-heptanedionato)cesium(40) Blending polymer 1(100) | PGPE(5,000) |
| Example Resist 9 | tris(1,3-diphenyl-1,3-propanedione)indium(40) Blending phenolic resin 1(100) | PGPE(5,000) |
| Example Resist 10 | tris(1,3-diphenyl-1,3-propanedione)indium(40) Blending phenolic resin 2(100) | PGPE(5,000) |
| Example Resist 11 | tris(1,3-diphenyl-1,3-propanedione)indium(40) Blending silsesquioxane-titanium oxide resin 1(50) | PGPE(4,500) water(500) |
| Example Resist 12 | tris(1,3-diphenyl-1,3-propanedione)indium(40) Blending silsesquioxane-zirconium oxide resin 1(50) | PGPE(4,500) water(500) |
| Example Resist 13 | tris(1,3-diphenyl-1,3-propanedione)indium(40) Blending silsesquioxane-hafnium oxide resin 1(50) | PGPE(4,500) water(500) |
| Example Resist 14 | tris(1,3-diphenyl-1,3-propanedione)indium(40) Blending silsesquioxane resin 1(50) | PGPE(4,500) water(500) |
| Example Resist 15 | tetra(2,2,6,6-tetramethyl-3,5-heptanedionatho) zirconium(40) Blending silsesquioxane resin 1(50) | PGPE(4,500) water(500) |
| Example Resist 16 | tris(2,2,6,6-tetramethyl-3,5-heptanedionatho) antimony(40) Blending silsesquioxane resin 1(50) | PGPE(4,500) water(500) |

TABLE 2

| | Metal salt/polymer/acid generator/ basic compound/crosslinker (pbw) | Solvent (pbw) |
|---|---|---|
| Comparative Resist 1 | bis(2,4-pentanedionato)magnesium(30) Blending polymer 1(100) | acetone(6,000) |
| Comparative Resist 2 | bis(2,4-pentanedionato)magnesium(30) Blending polymer 1(100) | 2-methoxy-ethanol(5,000) |
| Comparative Resist 3 | bis(2,4-pentanedionato)magnesium(30) Blending polymer 1(100) | methylene chloride(5,000) |
| Comparative Resist 4 | Blending polymer 1(100)/PAG1(8)/ Amine 1(0.6)/Crosslinker(8.0) | PGMEA(4,000) |
| Comparative Resist 5 | Hydrogensilsesquioxane(100) | MEK(7,000) |
| Comparative Resist 6 | Blending silsesquioxane resin 1(100) | PGEE(5,000) |
| Comparative Resist 7 | Blending silsesquioxane-titanium oxide resin 1(100) | PGEE(5,000) |
| Comparative Resist 8 | Blending silsesquioxane-zirconium oxide resin 1(100) | PGEE(5,000) |
| Comparative Resist 9 | Blending silsesquioxane-hafnium oxide resin 1(100) | PGEE(5,000) |

TABLE 3

| | | Resist | Coating uniformity | PEB temp. (°C.) | Sensitivity (μC/cm$^2$) | Resolution (nm) | LWR (nm) |
|---|---|---|---|---|---|---|---|
| Example | 1 | Example Resist 1 | OK | 110 | 80 | 75 | 3.2 |
| | 2 | Example Resist 2 | OK | 110 | 100 | 75 | 3.2 |
| | 3 | Example Resist 3 | OK | 110 | 82 | 75 | 3.2 |
| | 4 | Example Resist 4 | OK | 110 | 73 | 75 | 3.2 |
| | 5 | Example Resist 5 | OK | 110 | 75 | 70 | 3.4 |
| | 6 | Example Resist 6 | OK | 110 | 80 | 75 | 3.8 |
| | 7 | Example Resist 7 | OK | 110 | 82 | 70 | 3.8 |
| | 8 | Example Resist 8 | OK | — | 90 | 70 | 3.1 |
| | 9 | Example Resist 9 | OK | — | 120 | 70 | 3.6 |
| | 10 | Example Resist 10 | OK | 110 | 122 | 70 | 3.9 |
| | 11 | Example Resist 11 | OK | 110 | 130 | 70 | 3.8 |
| | 12 | Example Resist 12 | OK | 110 | 119 | 70 | 3.5 |
| | 13 | Example Resist 13 | OK | 110 | 122 | 70 | 3.3 |
| | 14 | Example Resist 14 | OK | 110 | 98 | 70 | 3.2 |
| | 15 | Example Resist 15 | OK | 110 | 133 | 70 | 3.8 |
| | 16 | Example Resist 16 | OK | 110 | 140 | 70 | 3.9 |
| Comparative Example | 1 | Comparative Resist 1 | NG | — | — | — | — |
| | 2 | Comparative Resist 2 | NG | — | — | — | — |
| | 3 | Comparative Resist 3 | NG | — | — | — | — |
| | 4 | Comparative Resist 4 | OK | 95 | 28.5 | 90 | 8.9 |
| | 5 | Comparative Resist 5 | OK | 110 | 300 | 70 | 3.9 |
| | 6 | Comparative Resist 6 | OK | 110 | — | * | — |
| | 7 | Comparative Resist 7 | OK | 110 | — | * | — |
| | 8 | Comparative Resist 8 | OK | 110 | — | * | — |
| | 9 | Comparative Resist 9 | OK | 110 | — | * | — |

* Pattern was not formed.

As seen from the results of Table 3, the resist compositions within the scope of the invention exhibit a sufficient resolution, an adequate sensitivity, and a fully reduced edge roughness. The resist compositions of Comparative Examples have a sufficient sensitivity, but their edge roughness is materially increased as compared with the inventive resist compositions.

It has been demonstrated that the resist composition of the invention is improved in film uniformity after coating, and exhibits a high resolution, high sensitivity, and minimal LER. Thus the resist composition is best suited as VLSI-forming resist material and mask pattern-forming material.

Although particular embodiments of the invention have been described in detail for purposes of illustration, various modifications and enhancements may be made without departing from the spirit and scope of the invention. Accordingly, the invention is not to be limited except as by the appended claims.

Japanese Patent Application No. 2011-029596 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A pattern forming process comprising the steps of coating a non-chemically amplified negative resist composition onto a substrate to form a resist film, baking, exposing to high-energy radiation, and developing with a developer, whereby the resist film in the exposed area is not dissolved in the developer whereas the resist film in the unexposed area is dissolved to form a negative pattern,
wherein said non-chemically amplified negative resist composition consists essentially of
a metal complex of a β-diketone, the metal being selected from the group consisting of magnesium, chromium, manganese, iron, cobalt, nickel, copper, zinc, silver, cadmium, indium, tin, antimony, cesium, zirconium, and hafnium,
at least one solvent selected from the group consisting of water, methanol, ethanol, n-propanol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-2-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, 1-heptanol, cyclohexanol, octanol, methyl lactate, ethyl lactate, propyl lactate, butyl lactate, propylene glycol, butanediol monomethyl ether, propylene glycol monomethyl ether, butanediol monoethyl ether, propylene glycol monoethyl ether, butanediol monopropyl ether, propylene glycol monopropyl ether, propylene glycol monomethoxymethyl ether, propylene glycol monoacetate, diacetone alcohol, allyl alcohol, propargyl alcohol, 3-methyl-1-pentyn-3-ol, 3-methyl-1-butyn-3-ol, furfuryl alcohol, tetrahydrofurfuryl alcohol, and glycidol, and
a resin having a weight-average molecular weight of 200 to 20,000 by GPC versus polystyrene standard and selected from the group consisting of phenolic resins, silicon oxide base resins, zirconium oxide base resins, zinc oxide base resins, titanium oxide base resins, hafnium oxide base resins, silsesquioxane-titanium oxide resins, silsesquioxane-zirconium oxide resins, and silsesquioxane-hafnium oxide resins,
wherein the metal complex of a β-diketone is contained in an amount of at least 30 parts by weight per 100 parts by weight of the resin.

2. The process of claim 1 wherein the metal complex of a β-diketone is selected from complexes of the following general formulae:

$$Mg^{2+}(R^1COCH_2COR^2)^-_2$$

$$Cr^{2+}(R^1COCH_2COR^2)^-_2 Cr^{3+}(R^1COCH_2COR^2)^-_3$$

$$Mn^{2+}(R^1COCH_2COR^2)^-_2 Mn^{3+}(R^1COCH_2COR^2)^-_3$$

$$Fe^{2+}(R^1COCH_2COR^2)^-_2 Fe^{3+}(R^1COCH_2COR^2)^-_3$$

$$Co^{2+}(R^1COCH_2COR^2)^-_2$$

$$Ni^{2+}(R^1COCH_2COR^2)^-_2$$

$$Cu^+(R^1COCH_2COR^2)^- Cu^{2+}(R^1COCH_2COR^2)^-_2$$

$$Zn^{4+}(R^1COCH_2COR^2)^- Zn^{2+}(R^1COCH_2COR^2)^-_2$$

$$Ag^+(R^1COCH_2COR^2)^-$$

$$Cd^{2+}(R^1COCH_2COR^2)^-_2$$

$$In^{3+}(R^1COCH_2COR^2)^-_3$$

$$Sn^{2+}(R^1COCH_2COR^2)^-_2 Sn^{4+}(R^1COCH_2COR^2)^-_4$$

$$Sb^{3+}(R^1COCH_2COR^2)^-_3$$

$$Cs^+(R^1COCH_2COR^2)^-$$

$$Zr^{4+}(R^1COCH_2COR^2)^-_4$$

$$Hf^{4+}(R^1COCH_2COR^2)^-_4$$

wherein $R^1$ and $R^2$ are each independently a straight, branched or cyclic $C_1$-$C_{20}$ alkyl group, $C_2$-$C_{20}$ alkenyl group, $C_2$-$C_{20}$ alkynyl group, or $C_6$-$C_{20}$ aryl group, which may contain a hydroxyl, alkoxy, ether, ester, amino, amide, sulfonic acid ester, halogen, cyano, nitro, carbonate, carbamate, thiol, sulfide, thioketone radical, or hetero-aromatic ring.

3. The process of claim 1 wherein the developer is alkaline water.

4. The process of claim 1 wherein the developer is an aqueous solution of at least one hydroxide selected from the group consisting of tetramethylammonium hydroxide, tetraethylammonium hydroxide, tetrapropylammonium hydroxide, tetrabutylammonium hydroxide, choline hydroxide, sodium hydroxide, and potassium hydroxide.

5. The process of claim 1 wherein the high-energy radiation is EUV radiation having a wavelength of 3 to 15 nm.

6. The process of claim 1 wherein the high-energy radiation is EB at an accelerating voltage of 1 to 150 keV.

7. The process of claim 1 wherein the phenolic resin is one selected from the group consisting of polyhydroxystyrene, polyhydroxynaphthalene, poly(hydroxyphenyl methacrylate), poly(hydroxynaphthyl methacrylate), copolymers thereof with styrene, vinylnaphthalene, vinylanthracene, vinylbiphenyl, vinylcarbazole, indene, acenaphthylene, nortricyclene derivatives, norbornene derivatives, maleic anhydride, maleimide derivatives, methacrylate derivatives, novolac resins, calixarene resins, and calix-resorcin resins.

* * * * *